United States Patent

Chang et al.

[11] Patent Number: 5,415,897
[45] Date of Patent: May 16, 1995

[54] METHOD OF DEPOSITING SOLID SUBSTANCE ON A SUBSTRATE

[75] Inventors: Edward Chang, Gillette; Shuen-Cheng Hwang, Chester, both of N.J.; Paul Stratton, Huddersfeld, United Kingdom

[73] Assignee: The BOC Group, Inc., New Providence, N.J.

[21] Appl. No.: 216,701

[22] Filed: Mar. 24, 1994

[51] Int. Cl.$^6$ ............................................. B05D 1/02
[52] U.S. Cl. .................................... 427/421; 427/426
[58] Field of Search ............................... 427/421, 426

[56] References Cited

U.S. PATENT DOCUMENTS

| | | | |
|---|---|---|---|
| 4,243,056 | 1/1981 | de la Burde et al. | 131/140 |
| 4,546,612 | 10/1985 | Santhanam | 62/55 |
| 4,882,204 | 11/1989 | Tenenbaum | 427/180 |
| 4,923,720 | 5/1990 | Lee et al. | 427/422 |
| 5,013,366 | 5/1991 | Jackson et al. | 134/1 |
| 5,026,898 | 11/1991 | McDermott et al. | 134/7 |
| 5,027,742 | 7/1991 | Lee et al. | 118/300 |
| 5,106,659 | 4/1992 | Hastings et al. | 427/421 |
| 5,150,822 | 9/1992 | Eitner, Jr. et al. | 222/145 |
| 5,169,433 | 12/1992 | Lindsay et al. | 71/118 |
| 5,290,604 | 3/1994 | Nielsen | 427/421 |

*Primary Examiner*—Shrive Beck
*Assistant Examiner*—Katherine A. Bareford
*Attorney, Agent, or Firm*—David M. Rosenblum; Larry R. Cassett

[57] ABSTRACT

A method of depositing a solid substance on the surface of the substrate in which the solid substance is dissolved in a solvent to create a first solution. The solid substance is less freely divided prior to dissolution than when deposited on the substrate and the deposition density of the solid substance on the substrate is regulated at least in part by solid substance concentration. The solid substance is insoluble in a liquified gas and the first solution is soluble in the liquified gas. The solvent also is capable of depressing the freezing point of the liquified gas upon expansion of the liquified gas. The first solution is dissolved in the liquified gas to create a second solution having a sufficient concentration of the solvent relative to the liquified gas that solidification of the liquified gas is substantially prevented upon the expansion thereof. Preferably, this concentration of solvent is a minimum to prevent overuse of environmentally hazardous solvents. The solution is sprayed against the substrate so that a portion of the liquified gas flashes into a vapor and the second solution containing a remaining portion of the liquified gas contacts and thereby coats the surface substrate. The remaining portion of the liquified gas is evaporated along with the solvent, so that the solid substance remains as a deposit on the substrate. The method has particular application to making very free depositions such as are required in the electronics industry to coat contacts of printed circuit boards with flux prior to soldering.

7 Claims, No Drawings

METHOD OF DEPOSITING SOLID SUBSTANCE ON A SUBSTRATE

BACKGROUND OF THE INVENTION

The present invention relates to a method of depositing a solid substance on a surface of a substrate in a finely divided deposition. More particularly the present invention relates to such a method in which the substance is dissolved to produce a solution which is in turn dissolved in a liquefied gas and sprayed against the substrate. Upon evaporation of the solvent and liquefied gas the substance is left as the deposit on the substrate.

There are a variety of deposition methods that are particularly adapted to deposit a variety of solids on various substrates. For instance, in soldering operations it is necessary to deposit flux on conductors of electrical components to be soldered on a printed circuit board. In such case, the printed circuit board and conductors can be said to serve as a substrate for the flux. Flux deposition is accomplished by foaming the flux and then brushing the flux containing suspension onto the conductors and conductive areas of the circuit board. This foregoing flux deposition method, however, applies an excessive amount of flux. More recently it has been the practice to dissolve the flux in a solvent and then spray the solution with compressed air onto the conductors and circuit board. Evaporation of the solvent leaves a finely divided deposit of the flux.

The problem of using a solvent to deposit a flux is that many solvents present environmental health hazards. Therefore, there has been a need in the art to replace potentially harmful solvents with environmentally safe compounds. Such a scheme can be found in U.S. Pat. No. 5,106,659 in which paint is thinned or diluted with liquid or supercritical carbon dioxide. The resulting mixture is then sprayed against the surface to be painted.

This paint spraying method of U.S. Pat. No. 5,106,659 is not applicable to all substances. For instance, in case of flux deposition, flux like paint, will not dissolve in carbon dioxide. Attempts to spray a mixture of flux and liquid carbon dioxide have met with failure because a portion of the liquid carbon dioxide, upon discharge from a nozzle into the ambient, expands to produce solid particles. The solid carbon dioxide ice particles act as an abrasive to remove any particles of flux that were initially deposited. Additionally, since flux is not in the finely divided form of paint pigments, flux solids will not be deposited in a uniform freely divided manner if simply mixed with carbon dioxide and sprayed against a substrate surface.

As will be discussed, the present invention relates to a method of depositing a solid substance, such as flux, on a substrate to produce a controlled, freely divided deposit on the substrate.

SUMMARY OF THE INVENTION

The present invention provides a method of delivering a solid substance to surface of the substrate. In accordance with the method, the solid substance is dissolved in a solvent to create a first solution. The solid substance is less finely divided prior to dissolution than when deposited on the substrate. For instance, the solid substance prior to dissolution can be made up of large granules and is deposited as a fine dust. The deposition density of the solid substance on the substrate is at least in part regulated by solid substance concentration within the first solution. In this regard, it is to be noted that the first solutions can be fully saturated to obtain the greatest about of solid substance being deposited on the substrate and on a unit area basis, the greatest "deposition density". The solid substance is insoluble in a liquefied gas and the first solution is soluble in the liquefied gas. Additionally, the solvent is capable of depressing the freezing point of the liquefied gas upon expansion of the liquefied gas. The first solution is dissolved in the liquefied gas to create a second solution having a sufficient concentration of the solvent relative to the liquefied gas that solidification of the liquefied gas is substantially prevented upon the expansion thereof. The second solution is sprayed against the substrate so that a portion of the liquefied gas flashes into a vapor and the second solution, which contains a remaining portion of the liquefied gas, thereby coats the substrate. The remaining portion of the liquefied gas and the solvent is then evaporated so that the solid substance remains as a deposit on the substrate.

Preferably, the concentration of the solvent within the solution is a minimum yet sufficient concentration of the solvent relative to the liquified gas that solidification of the liquefied gas is prevented upon expansion. In this manner, the use of solvent can be minimized while the deposit of the substance can be in a very free dispersion.

DETAILED DESCRIPTION

The present invention can be accomplished in a variety of ways. Generally though, the present invention will have most application to depositions on substrates under conditions of ambient atmosphere. However, it is understood that the present invention will also have applications to depositions that are to be conducted at subatmospheric pressures as well as superatmospheric pressures and also non-air or inerting atmospheres. Furthermore, although the present invention is discussed relative to flux deposition, it is understood that its application is not limited to flux deposition.

As a fast step, the solid substance that is to be deposited on a substrate is first mixed with a solvent to create a fast solution. The concentration of the solid substance within the fast solution can be pre-determined to create the degree of density required in the deposition. As the concentration increases, more of the substance will be deposited. In case of flux, the substance can be an organic acid, such as, but not limited to, adipic acid, salicylic acid and citric acid. Suitable solvents would include alcohols and ketones such as methanol and acetone. By way of example, a first solution made up of adipic acid and methanol having a solvent concentration of about ten percent by weight. This solution is under normal room temperature a saturated solution to produce the greatest deposition density possible.

After the first solution is created, the first solution is then dissolved in a liquefied gas, preferably liquid carbon dioxide for flux deposition. Depending upon the application of the present invention and the materials involved, other liquefied gases are possible, for instance, propane. In the present invention, the substance is essentially not soluble in the liquefied gas but the solution of solvent and substance is soluble in the liquefied gas. It is to be noted that the term "soluble" as used herein and in the claims meet the definition of such term as found in inorganic chemistry, namely, dissociation of the solid substance within the solvent.

The solvent in which the substance is initially dissolved is capable of depressing the freezing point of the liquified gas upon expansion of the liquified gas. In case of flux deposition, the solution of flux and solvent is dissolved in liquid carbon dioxide which is then held within a gas cylinder at a pressure of approximately 900 psi. Since an acidic solution is obtained, the second solution should be maintained in a nickel or nickel plated gas cylinder.

In order to accomplish the deposit, a cryogenic line is attached to a nozzle, known in the art, to direct the carbon dioxide gas, substance and second solution onto the substrate. In case of flux deposition a typical cone nozzle can be used. It is to be noted that the type of nozzle will also affect deposition density as will other spraying parameters. At normal ambient temperatures, it is the liquid carbon dioxide, held at a high pressure which will serve as a propellent to cause the solution to spray onto the substrate. The change in pressure from storage pressure to ambient atmospheric pressure will cause an expansion of the liquid carbon dioxide. If the substance to be applied were simply dissolved in the carbon dioxide, the carbon dioxide would vaporize and solidify into small ice crystal as it was sprayed against the substrate. The effect of this would be to remove the deposited substance from the substrate. The solvent counters this by depressing the freezing point of the liquid carbon dioxide. This substantially prevents solidification of the liquified gas.

In all cases of the practice of the present invention, there will exist the sufficient concentration of the solvent relative to the liquified gas so that solidification is prevented. Additionally, this concentration of solvent should be at a minimum to conserve the use of potentially environmentally hazardous solvents. In case of flux depositions, the concentration of solvent within the liquid carbon dioxide is a fifteen percent by weight solution of methanol and carbon dioxide. Thus, when the second solution of solvent, liquid carbon dioxide and flux or other substances are sprayed against the substrate, a portion of the liquified gas will flash into vapor but there will exist a remaining portion of solution containing liquified gas which will coat the substrate.

Once the substrate is coated, the remaining portion of the liquid carbon dioxide and solvent, methanol for flux depositions, will evaporate under ambient room temperature conditions so that the substance will remain as a deposit on the substrate. It is understood though that such evaporation might have to be externally facilitated, depending upon the solvent, and liquified gas and the conditions of coating.

While the present invention has been described relative to a preferred embodiment, it will be understood by those skilled in the art that numerous additions, changes, and modifications can be made without departing from the spirit and scope of the present invention.

We claim:

1. A method of depositing a solid substance on a surface of a substrate, comprising:
    dissolving the solid substance in a solvent to create a first solution, the solid substance being less freely divided prior to dissolution than when deposited on said substrate and deposition density of said solid substance on said substrate being at least in part regulated by solid substance concentration within said first solution;
    the solid substance being insoluble in a liquified gas, the first solution being soluble in said liquified gas, and the solvent capable of depressing the freezing point of the liquified gas upon expansion of said liquified gas;
    dissolving said first solution in said liquified gas to create a second solution having a sufficient solvent concentration of said solvent relative to said liquified gas that solidification of said liquified gas is substantially prevented upon the expansion thereof;
    spraying said second solution against said substrate so that a portion of said liquified gas flashes into a vapor and the said second solution containing a remaining portion of said liquified gas contacts and thereby coats said substrate; and
    evaporating said remaining portion of said liquified gas and said solvent so that said solid substance remains as the deposit on said substrate.

2. The method of claim 1 wherein said first solution is a saturated solution.

3. The method of claim 1 wherein said solvent concentration is at a minimum required to substantially prevent solidification of said liquified gas on the expansion thereof.

4. The method of claim 1 wherein said liquified gas comprises liquid carbon dioxide.

5. The method of claim 1 in which said solid substance is a flux formed from an organic acid comprising adipic acid, salicylic acid, or citric acid.

6. The method of claim 5 wherein said solvent comprises an organic solvent comprising methanol, alcohol or acetone.

7. The method of claim 6 wherein said solvent comprises methanol, said liquefied gas comprises liquid carbon dioxide, and said solvent concentration of said solvent relative to said liquified gas is about 15 percent by weight of said methanol in said liquid carbon dioxide.

* * * * *